US006797682B2

(12) United States Patent
Hara et al.

(10) Patent No.: US 6,797,682 B2
(45) Date of Patent: Sep. 28, 2004

(54) RESIST STRIPPER

(75) Inventors: Yasushi Hara, Shinnanyo (JP); Masahiro Aoki, Shinnanyo (JP); Hiroaki Hayashi, Hikari (JP)

(73) Assignee: Tosoh Corporation, Yamaguchi-ken (JP)

( * ) Notice: Subject to any disclaimer, the term of this patent is extended or adjusted under 35 U.S.C. 154(b) by 0 days.

(21) Appl. No.: 09/996,773

(22) Filed: Nov. 30, 2001

(65) Prior Publication Data

US 2002/0128164 A1 Sep. 12, 2002

(30) Foreign Application Priority Data

| Nov. 30, 2000 | (JP) | .................................... | 2000-369625 |
| Dec. 27, 2000 | (JP) | .................................... | 2000-399153 |
| Dec. 27, 2000 | (JP) | .................................... | 2000-399154 |
| Mar. 13, 2001 | (JP) | .................................... | 2001-070360 |
| Apr. 20, 2001 | (JP) | .................................... | 2001-123252 |

(51) Int. Cl.$^7$ ............................................. C11D 17/00
(52) U.S. Cl. ....................... 510/175; 510/176; 438/692; 438/693
(58) Field of Search ................................ 510/175, 176, 510/177, 505, 421, 432, 475, 372, 499; 438/692, 693; 134/2, 3, 40, 41

(56) References Cited

U.S. PATENT DOCUMENTS

| 4,655,975 | A | * | 4/1987 | Snoble ........................ 562/41 |
| 5,393,386 | A | * | 2/1995 | Aoyama et al. ............. 205/437 |
| 5,466,389 | A | * | 11/1995 | Ilardi et al. .................. 510/175 |
| 5,489,557 | A | * | 2/1996 | Jolley ......................... 438/476 |
| 5,840,127 | A | | 11/1998 | Hayashida et al. |
| 5,885,362 | A | * | 3/1999 | Morinaga et al. ............... 134/2 |
| 5,911,836 | A | * | 6/1999 | Hada et al. ..................... 134/2 |
| 5,989,353 | A | * | 11/1999 | Skee et al. ..................... 134/2 |
| 6,030,491 | A | | 2/2000 | Vaartstra |
| 6,228,823 | B1 | * | 5/2001 | Morinaga et al. ........... 510/175 |
| 6,323,169 | B1 | * | 11/2001 | Abe et al. .................... 510/176 |
| 6,428,387 | B1 | * | 8/2002 | Hunt et al. ..................... 451/8 |
| 6,465,403 | B1 | * | 10/2002 | Skee .......................... 510/175 |

FOREIGN PATENT DOCUMENTS

| EP | 0 597 100 A1 | 5/1994 |
| EP | 0 608 545 A1 | 8/1994 |
| EP | 1 001 012 A1 | 5/2000 |
| EP | 1 005 072 A1 | 5/2000 |
| JP | 01165524 A * | 6/1989 |
| WO | WO 95/04372 | 2/1995 |
| WO | WO 99/01530 | 1/1999 |
| WO | WO 99/02637 | 1/1999 |
| WO | WO 99/41345 | 8/1999 |
| WO | WO 99/60448 | 11/1999 |

OTHER PUBLICATIONS

Database WPI, Section Ch, Week 199527, Derwent Publications Ltd., London, GB; AN 1995–204353, XP002192035 and JP 07–118885 A (Mitsubishi Gas Chem. Co., Inc.), May 9, 1995, abstract.

Database WPI, Section Ch, Week 199630, Derwent Publications Ltd., London, GB; AN 1996–293098, XP002192036 and JP 08–124888 A (Mitsubishi Gas Chem. Co., Inc.), May 17, 1996, abstract.

* cited by examiner

Primary Examiner—Gregory Webb
(74) Attorney, Agent, or Firm—Sughrue Mion, PLLC

(57) ABSTRACT

A resist stripper which comprises a peroxide and a quaternary ammonium salt.

14 Claims, No Drawings

RESIST STRIPPER

The present invention relates to a stripper to strip a photoresist layer and a titanium oxide in production process of e.g. semiconductor integrated circuits, printed wiring boards and liquid crystals.

A semiconductor integrated circuit is produced by such a method that a photoresist is coated on a substrate, followed by exposure and development, then etching is carried out to form a circuit, and then the photoresist is stripped from the substrate, or ashing is carried out after formation of the circuit, the resist is removed, and then the remaining resist residue is stripped. To strip the photoresist from the substrate, or to strip the resist residue from the substrate, various resist strippers have conventionally been proposed.

For example, JP-A-62-49355 discloses a resist stripping liquid composition employing an alkanolamine. However, the stripping liquid composition employing an alkanolamine is insufficient for stripping of a resist residue degenerated to have inorganic properties by a treatment such as dry etching, ashing or ion implantation. Further, in a latest submicron treatment technique, a metal material containing e.g. TiN or TiSi is used, but in a case of using such a metal material, a stable by-product such as a titanium oxide tends to form during the treatment. A titanium oxide could not be stripped with a conventionally used alkanolamine.

Accordingly, as a resist stripping liquid composition having more excellent stripping properties, one containing hydroxylamine has been proposed in recent years. For example, JP-A-4-289866 proposes a resist stripping liquid composition containing hydroxylamine and an alkanolamine, and JP-A-6-266119 proposes a resist stripping liquid composition containing hydroxylamine, an alkanolamine and catechol. Although this resist stripping composition containing hydroxylamine provides excellent titanium oxide stripping properties, it is an unstable compound, and accordingly there is a risk or e.g. decomposition or explosion.

In addition to the above amine type resist stripper showing basicity, a resist stripper by a combination of hydrogen peroxide and an acid has also been proposed (e.g. JP-A-64-15740). A titanium oxide is generally known to dissolve in hydrogen peroxide in an acidic condition, however, combination of hydrogen peroxide and an acid is not optimal for stripping of an alkali development type photoresist which is likely to be stripped in a basic condition.

As described above, conventionally proposed resist strippers have insufficient stripping properties, particularly stripping properties of a titanium oxide, and with which there is a risk of decomposition or explosion. Accordingly, it is an object of the present invention to provide a resist stripper containing no hydroxylamine having a high risk of explosion and providing excellent resist stripping properties and titanium oxide stripping properties.

The present inventors have conducted extensive studies on a resist stripper and as a result, found that a resist stripper comprising a peroxide and a quaternary ammonium salt is useful as a resist stripper having excellent resist stripping properties and titanium oxide stripping properties, and the present invention has been accomplished on the basis of this discovery.

Namely, the present invention resides in a resist stripper comprising a peroxide and a quaternary ammonium salt.

Now, the present invention will be described in detail with reference to the preferred embodiments.

In the present invention, stripping is to remove a resist or a resist residue remaining after formation of a circuit, obtained by coating a photoresist on a substrate, followed by exposure and development, then carrying out a treatment such as etching. Namely, development is removal of a resist solubilized in liquid by exposure of a photoresist, and stripping is removal of a portion remaining after the development or a portion which becomes hardly soluble in liquid by means of a treatment such as etching or ashing.

The resist stripper of the present invention is useful to strip a photoresist or its residue. Namely, a photoresist is coated on a substrate, followed by exposure and development, and then a treatment such as etching is carried out to form a circuit, and then the photoresist is stripped by the stripper of the present invention. Otherwise, after formation of the circuit, ashing is carried out to remove the resist, and then the remaining resist residue is stripped by the stripper of the present invention.

The resist stripper of the present invention strips a titanium oxide which is a by-product in formation of a circuit, as well as the resist. A titanium oxide, particularly a tetravalent titanium oxide is an extremely stable compound and is hardly soluble in water. As the titanium oxide, one having various valency such as tetravalent, trivalent or bivalent may be mentioned, and it is the tetravalent titanium oxide (titanium dioxide) that is most insoluble. On the other hand, a most soluble titanium species is $Ti^{2+}$, and a solid phase titanium oxide is known to easily be dissolved by reduction in an acidic region. However, the resist stripper of the present invention reduces and dissolves, and strips various titanium oxides including titanium dioxide which is most insoluble in an alkaline region at which the resist can be stripped.

Essential components of the resist stripper of the present invention are a peroxide and a quaternary ammonium salt.

The peroxide to be used in the resist stripper of the present invention acts as a reducing agent.

The peroxide to be used in the resist stripper of the present invention is at least one member selected from the group consisting of hydrogen peroxide, a persulfate, a perborate, a percarbonate, an organic peracid and an organic hydroperoxide. Among them, hydrogen peroxide is industrially preferred since it is available at a lowest cost.

Hydrogen peroxide may be used as an anhydride or an aqueous solution, or as a peroxyhydrate of e.g. urea or a quaternary ammonium salt (one having hydrogen peroxide coordinated to urea or a quaternary ammonium salt, such as water in water of crystallization).

The inorganic per salt such as persulfate, perborate or percarbonate is used preferably as a salt with ammonia or an amine or as a quaternary ammonium salt. Other salts such as sodium salt or potassium salt may be used, however, removal of metal ions is required, such being unfavorable industrially.

The organic peracid is not particularly limited so long as it is stable when mixed with a quaternary ammonium salt, and it may, for example, be performic acid, peracetic acid, benzoyl peroxide or m-chloroperbenzoic acid.

The organic hydroperoxide is a compound represented by a general formula R—OOH (wherein R is an alkyl or aryl) and examples of which include butyl hydroperoxide and cumyl hydroperoxide.

The quaternary ammonium salt to be used for the resist stripper of the present invention may be any one showing alkalinity. Examples of the quaternary ammonium salt include quaternary ammonium hydroxide, a quaternary ammonium carbonate, a quaternary ammonium carboxylate and a quaternary ammonium peroxycarboxylate. They are all alkaline substances and they may be used alone or as a mixture. Among these quaternary ammonium salts, particularly preferred is hydroxide or a carboxylate. As a carboxylic acid, either aliphatic carboxylic acid or aromatic carboxylic acid may be used, but an aromatic carboxylic acid is preferred industrially since it has a good stability. The aromatic carboxylic acid may, for example, be benzoic acid, salicylic acid or phthalic acid. The aliphatic carboxylic acid may, for example, be acetic acid, lactic acid, adipic acid or propionic acid.

The cation moiety in the quaternary ammonium salt to be used for the resist stripper of the present invention, i.e. the quaternary ammonium, may be a tetraalkylammonium such as tetramethylammonium, tetraethylammonium, tetra n-propylammonium, triethylmethylammonium or dodecyltrimethylammonium, a benzyl trialkylammonium such as benzyl trimethylammonium, or an alkyl-hydroxyalkylammonium such as trimethyl-2-hydroxyethylammonium (choline).

To the resist stripper of the present invention, in addition to the peroxide and the quaternary ammonium salt, at least one member selected from the group consisting of an amine, a water soluble organic solvent and water may be added. As an amine to be added to the resist stripper, an amine which is conventionally used as a resist stripper may be added. Specific examples of an amine include alkanolamines such as monoethanolamine, diethanolamine, triethanolamine, 2-(2-aminoethoxy)ethanol, N-(2-aminoethyl)ethanolamine, N,N-dimethylethanolamine, N,N-diethylethanolamine, N,N-dibutylethanolamine, N-methylethanolamine, N-ethylethanolamine, N-butylethanolamine, N-methyldiethanolamine, N-ethyldiethanolamine, monoisopropanolamine, diisopropanolamine, triisopropanolamine, N-(2-hydroxyethyl) piperazine and N-(2-hydroxyethyl)morpholine, ethyleneamines such as ethylenediamine, diethylenetriamine, triethylenetetramine, tetraethylenepentamine, pentaethylenehexamine, piperazine, N-(2-aminoethyl)piperazine and triethylenediamine, N-alkylethyleneamines such as N,N,N',N'-tetramethylethylenediamine, N,N,N',N",N"-pentamethyldiethylenetriamine, N-methylpiperazine and N,N,N'-trimethylaminoethylpiperazine, diamines other than ethyleneamine, such as propanediamine, butanediamine and hexamethylenediamine, imidazoles such as imidazole, 1-methylimidazole, 2-methylimidazole, 1,2-dimethylimidazole, 1,2,4,5-tetramethylimidazole and 2-ethyl-4-methylimidazole, monoamines such as morpholine, cyclohexylamine, 2-ethyl-hexylamine, benzylamine and aniline, and alkylamines such as triethylamine, tripropylamine and tributylamine. Further, a hydroxylamine may be added although it is not preferred in view of corrosion or risk. These amines may be used alone or in combination as a mixture of at least two.

The water soluble organic solvent to be used in the present invention may be one which is conventionally used as a resist stripper. Examples of the water soluble organic solvent include sulfoxides such as dimethylsulfoxide, sulfones such as dimethylsulfone and diethylsulfone, amides such as N,N-dimethylformamide, N,N-diethylformamide, N,N-dimethylacetamide and N,N-diethylacetamide, lactams such as N-methyl-2-pyrrolidone, N-ethyl-2-pyrrolidone, N-propyl-2-pyrrolidone and N-hydroxyethyl-2-pyrrolidone, imidazolidinones such as 1,3-dimethyl-2-imidazolidinone, glycols such as ethylene glycol, diethylene glycol, triethylene glycol, propylene glycol, dipropylene glycol and tripropylene glycol, and glycol ethers such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether and dipropylene glycol monobutyl ether. These water soluble organic solvents may be used alone or in combination as a mixture of at least two.

To the resist stripper of the present invention, a conventionally used anticorrosive may be added. The anticorrosive may, for example, be a carboxylic acid such as formic acid, acetic acid, propionic acid, octylic acid, adipic acid, pimelic acid, sebacic acid, suberic acid, azelaic acid, benzoic acid, salicylic acid or phthalic acid, an aminopolycarboxylic acid such as nitrilo triacetic acid, ethylenediaminetetraacetic acid or diethylenetriaminepentaacetic acid, an aromatic hydroxyl group-containing compound such as phenol, resorcinol, pyrocatechol or pyrogallol, an azole such as pyrrole, imidazole, triazole or tetrazole, or a sugar such as glucose, sucrose or fructose.

In the resist stripper of the present invention, proportions of the peroxide, the quaternary ammonium salt, water, the amine and the water soluble organic solvent vary depending upon the compounds to be used and thereby be hardly limited. However, the hydrogen peroxide is from 0.1 to 30 wt %, the quaternary ammonium salt is from 1 to 50 wt %, water is from 1 to 90 wt %, the amine is from 1 to 50 wt % and the water soluble organic solvent is from 1 to 50 wt %. Preferably, the hydrogen peroxide is from 0.5 to 25 wt %, the quaternary ammonium salt is from 5 to 50 wt %, water is from 1 to 90 wt %, the amine is from 1 to 40 wt % and the water soluble organic solvent is from 1 to 50 wt %. More preferably, the peroxide is from 1 to 25 wt %, the quaternary ammonium salt is from 5 to 40 wt %, water is from 1 to 90 wt %, the amine is from 1 to 30 wt % and the water soluble organic solvent is from 1 to 50 wt %. These compounds may be used beyond the above ranges, but the stripping properties of the resist and stability tend to decrease.

The resist stripper of the present invention may be used by adding each component when the resist is stripped, or the components may be preliminarily mixed.

The quaternary ammonium salt and the peroxide to be used for the resist stripper of the present invention may be present in a form of a mere mixture or in a form of one having the peroxide coordinated to the quaternary ammonium salt, such as a peroxyhydrate of a quaternary ammonium salt.

The peroxyhydrate having hydrogen peroxide coordinated to a quaternary ammonium salt, such as water in water of crystallization, is a stable compound, and it is possible to isolate it in the form of crystals in the air at room temperature. As a method to produce the peroxyhydrate of a quaternary ammonium salt, a conventional method for producing a peroxyhydrate can be employed, and the method is not particularly limited. A method of adding hydrogen peroxide in an equivalent amount or more to an aqueous solution of a quaternary ammonium salt, followed by heating to decompose excess hydrogen peroxide, a method of similarly adding hydrogen peroxide in an equivalent amount or more to an aqueous solution of a quaternary ammonium salt, then adding e.g. an enzyme, a metal salt or a metal thereto to decompose excess hydrogen peroxide, or a method of gradually adding hydrogen peroxide in an equivalent amount or less to a quaternary ammonium salt, may, for example, be mentioned. Further, it is allowed to use a solvent other than water for production. When hydrogen peroxide is coordinated to the quaternary ammonium salt to form a peroxyhydrate, even when the peroxyhydrate is mixed with an organic substance such as an amine which is easily oxidized with hydrogen peroxide, it does not react with the peroxyhydrate and is stable, and handling tends to be easy. Namely, when a peroxide is coordinated to a quaternary ammonium salt, in a case where another component is added to the resist stripper of the present invention, reaction of the peroxide with the additive and the reaction of the quaternary ammonium salt with the additive are suppressed, whereby wider ranges of substances can be used as an additive.

The resist stripper of the present invention can be utilized for a resist which can be developed with an aqueous alkali solution.

The resist stripper of the present invention is useful to strip a photoresist membrane coated on an inorganic substrate, a photoresist layer remaining after dry etching of a photoresist membrane coated on an inorganic substrate, or a photoresist residue remaining after ashing is carried out after dry etching, and to strip by-products such as titanium oxide. At the time of its use, stripping may be accelerated by heating or ultrasonic waves.

The resist stripper of the present invention is used usually by an immersion method, but other methods may also be employed.

Now, the present invention will be explained in further detail with reference to Examples and Comparative Examples. However, it should be understood that the present invention is by no means restricted to such specific Examples.

EXAMPLES 1 to 27 and COMPARATIVE EXAMPLES 1 to 8

A commercially available positive photoresist was coated in a thickness of 2 μm on a silicon wafer, followed by prebaking. Then, exposure by means of a mask pattern and development with tetramethylammonium hydroxide were carried out. Etching was carried out, and then plasma ashing treatment was carried out. This silicon wafer was immersed in a stripping solution as identified in Table 1 at 80° C. for 30 minutes, then washed with water and dried. The surface was observed by a scanning electron microscope to examine stripping properties of the resist degenerated membrane and stripping properties of a titanium oxide.

Further, corrosiveness of a metal was evaluated from weight change and surface observation after test specimen of each metal (copper, aluminum) were immersed in a resist stripper as identified in Table 2 at 50° C. for 30 minutes.

Here, each of stripping solutions in Examples was prepared by adding a peroxide to a quaternary ammonium salt aqueous solution at 30° C., removing excess water and then adding an amine and a water soluble organic solvent. In a case of hydrogen peroxide, a 35% aqueous hydrogen peroxide solution was used, and the aqueous hydrogen peroxide solution was added to a quaternary ammonium salt aqueous solution at 80° C. The compositions are shown in Tables 1 and 2, and the rest consists of water in each Example.

Resist Stripping Properties and Titanium Oxide Stripping Properties

Stripping properties of the resist degenerated membrane and stripping properties of the titanium oxide were evaluated on the basis of the following standards:
○: Good stripping properties
Δ: Some remained
X: Most remained Corrosiveness of Metal Corrosiveness against copper and aluminum was evaluated on the basis of the following standards (no test could be conducted with respect to hydroxylamine, since it decomposed when contacted with copper):
○: No corrosion
Δ: Some corrosion observed
X: Severe corrosion observed Here, the following abbreviations were used to simplify the description in Tables 1 and 2.

TMAH: Tetramethylammonium hydroxide
TEAH: Tetraethylammonium hydroxide
TPAH: Tetra-n-propylammonium hydroxide
TMHEAH: Trimethyl-2-hydroxyethylammonium hydroxide
TMAC: Tetramethylammonium carbonate
TPAC: Tetra-n-propylammonium carbonate
TMHEAC: Trimethyl-2-hydroxyethylammonium carbonate
BTMAC: Benzyltrimethylammonium carbonate
TMAA: Tetramethylammonium acetate
TMAAP: Tetramethylammonium peracetate
TMAS: Tetramethylammonium salicylate
TMAB: Tetramethylammonium benzoate
TMAL: Tetramethylammonium lactate
TPAP: Tetra-n-propylammonium propionate
BTMAA: Benzyltrimethylammonium adipate
MEA: Monoethanolamine
HA: Hydroxylamine
TETA: Triethylenetetramine
HPO: Hydrogen peroxide
APS: Ammonium persulfate
APB: Ammonium perborate
APC: Ammonium percarbonate
BPO: Benzoyl peroxide
TBHPO: Tertiary butyl hydroperoxide
NMP: N-methyl-2-pyrrolidone
DMSO: Dimethylsulfoxide

TABLE 1

| | Composition (wt %) | | | | Stripping properties | |
|---|---|---|---|---|---|---|
| | Quaternary ammonium salt | Peroxide | Others | | Resist | Titanium oxide |
| Example 1 | TMAH(16) | HPO(6) | — | — | ○ | ○ |
| Example 2 | TMAH(14) | HPO(5) | TETA(11) | — | ○ | ○ |
| Example 3 | TMAH(14) | HPO(5) | — | DMSO(11) | ○ | ○ |
| Example 4 | TEAH(30) | HPO(15) | — | — | ○ | ○ |
| Example 5 | TEAH(16) | HPO(10) | TETA(4) | DMSO(10) | ○ | ○ |
| Example 6 | TPAH(7) | HPO(3) | — | — | Δ | ○ |
| Example 7 | TMHEAH(20) | HPO(5) | — | — | ○ | ○ |
| Example 8 | TMAH(10) | APS(5) | — | — | ○ | Δ |
| Example 9 | TMAH(8) | APB(2) | — | — | ○ | Δ |
| Example 10 | TEAH(12) | APC(3) | — | DMSO(5) | ○ | Δ |

TABLE 1-continued

| | Composition (wt %) | | | | Stripping properties | |
|---|---|---|---|---|---|---|
| | Quaternary ammonium salt | Peroxide | Others | | Resist | Titanium oxide |
| Example 11 | TEAH(7) | BPO(5) | TETA(5) | — | ○ | Δ |
| Example 12 | TPAH(15) | TBHPO(5) | — | TETA(5) | ○ | Δ |
| Comparative Example 1 | TMAH(16) | — | — | — | Δ | X |
| Comparative Example 2 | — | HPO(6) | — | — | X | Δ |
| Comparative Example 3 | — | APS(5) | — | — | X | X |
| Comparative Example 4 | MEA(16)* | — | TETA(4) | DMSO(10) | Δ | X |
| Comparative Example 5 | HA(16)* | — | TETA(4) | DMSO(10) | ○ | ○ |

*Each of MEA and HA is an amine, not a quaternary ammonium salt.

TABLE 2

| | Composition (wt %) | | | Stripping properties | | Corrosiveness | |
|---|---|---|---|---|---|---|---|
| | Quaternary ammonium salt | Peroxide | Others | Resist | Titanium oxide | Al | Cu |
| Example 13 | TMAC(16) | HPO(6) | | ○ | ○ | ○ | ○ |
| Example 14 | TPAC(16) | HPO(6) | | ○ | ○ | ○ | ○ |
| Example 15 | BTMAC(16) | HPO(6) | | ○ | ○ | ○ | ○ |
| Example 16 | TMAC(40) | HPO(15) | | ○ | ○ | ○ | ○ |
| Example 17 | TMAC(3) | HPO(1) | | ○ | ○ | ○ | ○ |
| Example 18 | TMAC(5) | HPO(3) | DMSO(10) | ○ | ○ | ○ | ○ |
| Example 19 | TMHEAC(20) | HPO(5) | NMP(50) | ○ | ○ | ○ | ○ |
| Example 20 | TMAA(16) | HPO(6) | | ○ | ○ | ○ | ○ |
| Example 21 | TMAS(10) | HPO(5) | | ○ | ○ | ○ | ○ |
| Example 22 | TMAB(5) | HPO(2) | | ○ | ○ | ○ | ○ |
| Example 23 | TMAL(16) | HPO(15) | | ○ | ○ | ○ | ○ |
| Example 24 | TPAP(16) | HPO(10) | | ○ | ○ | ○ | ○ |
| Example 25 | BTMAA(5) | HPO(3) | DMSO(10) | ○ | ○ | ○ | ○ |
| Example 26 | TMAAP(20) | HPO(5) | NMP(50) | ○ | ○ | ○ | ○ |
| Example 27 | TMAS(5), TMAH(5) | HPO(5) | | ○ | ○ | ○ | ○ |
| Comparative Example 6 | TMAH(16) | HPO(6) | | ○ | ○ | X | Δ |
| Comparative Example 7 | MEA(16)* | — | | Δ | X | ○ | X |
| Comparative Example 8 | HA(16)* | — | | ○ | ○ | Δ | — |

*Each of MEA and HA is an amine, not a quaternary ammonium salt.

EXAMPLES 28 to 34

A resist stripping solution employing a peroxyhydrate of a quaternary ammonium salt was examined in the same manner as in Examples 1 to 27. The compositions and results are shown in Table 3.

Production Example of peroxyhydrate of tetramethylammonium hydroxide is shown below, and peroxyhydrates of other quaternary ammonium salts were produced in the same manner.

PRODUCTION EXAMPLE 590 g (0.97 mol) of a 15% tetramethylammonium hydroxide was heated to 80° C., and 150 g (1.54 mol) of a 35% aqueous hydrogen peroxide solution was dropwise added thereto. The mixture was heated until blowing due to decomposition of excess hydrogen peroxide disappeared, and then water was distilled off under reduced pressure to obtain peroxyhydrate of tetramethylammonium hydroxide.

IR of the peroxyhydrate of tetramethylammonium hydroxide (KBr tablet): 1489, 1404, 949 cm$^{-1}$ This peroxyhydrate of tetramethylammonium hydroxide was dissolved in water, and an amine and a water soluble organic solvent were added thereto to prepare a resist stripping solution.

Here, the following abbreviations were used to simplify the description.

TMAH-H: Peroxyhydrate of tetramethylammonium hydroxide
TEAH-H: Peroxyhydrate of tetraethylammonium hydroxide
TPAH-H: Peroxyhydrate of tetra-n-propylammonium hydroxide
TMHEAH-H: Peroxyhydrate of trimethyl-2-hydroxyethylammonium hydroxide

TABLE 3

| Example | Composition (wt %) | | | | Resist stripping properties | Titanium oxide stripping properties |
|---|---|---|---|---|---|---|
| 28 | TMAH-H(22) | Water (78) | | | ○ | ○ |
| 29 | TMAH-H(19) | Water (70) | TETA(11) | | ○ | ○ |
| 30 | TMAH-H(19) | Water (70) | | DMSO(11) | ○ | ○ |
| 31 | TEAH-H(45) | Water (55) | | | ○ | ○ |
| 32 | TEAH-H(26) | Water (60) | TETA(4) | DMSO(10) | ○ | ○ |
| 33 | TPAH-H(10) | Water (90) | | | Δ | ○ |
| 34 | TMHEAH-H(25) | Water (75) | | | ○ | ○ |

The resist stripper of the present invention contains no hydroxylamine which is unstable and is highly hazardous, and is useful as a resist stripper showing excellent resist stripping properties and titanium oxide stripping properties.

The entire disclosures of Japanese Patent Application No. 2000-369625 filed on Nov. 30, 2000, Japanese Patent Application No. 2000-399153 filed on Dec. 27, 2000, Japanese Patent Application No. 2000-399154 filed on Dec. 27, 2000, Japanese Patent Application No. 2001-070360 filed on Mar. 13, 2001 and Japanese Patent Application No. 2001-123252 filed on Apr. 20, 2001 including specifications, claims and summaries are incorporated herein by reference in their entireties.

What is claimed is:

1. A resist stripper which consists of hydrogen peroxide, a quaternary ammonium salt, water and a water soluble organic solvent.

2. The resist stripper according to claim 1, wherein the water soluble organic solvent is at least one member selected from the group consisting of a sulfoxide, a sulfone, an amide, a lactam, an imidazolidinone, a glycol and a glycol ether.

3. The resist stripper according to claim 1, wherein the water soluble organic solvent is dimethyl sulfoxide.

4. The resist stripper according to claim 1, wherein the quaternary ammonium salt is at least one member selected from the group consisting of quaternary ammonium hydroxide, a quaternary ammonium carbonate, a quaternary ammonium carboxylate and a quaternary ammonium peroxycarboxylate.

5. The resist stripper according to claim 1, wherein the quaternary ammonium salt is quaternary ammonium hydroxide.

6. The resist stripper according to claim 4, wherein the carboxylic acid in the quaternary ammonium carboxylate is an aromatic carboxylic acid.

7. The resist stripper according to claim 6, wherein the carboxylic acid in the quaternary ammonium carboxylate is at least one member selected from the group consisting of benzoic acid, salicylic acid and phthalic acid.

8. The resist stripper according to claim 1, wherein the quaternary ammonium in the quaternary ammonium salt is at least one member selected from the group consisting of a tetraalkyl ammonium, a benzyltrialkyl ammonium and an alkyl-hydroxyalkyl ammonium.

9. The resist stripper according to claim 1, wherein the quaternary ammonium in the quaternary ammonium salt is a tetraalkyl ammonium.

10. The resist stripper according to claim 1, wherein the hydrogen peroxide and the quaternary ammonium salt are peroxyhydrate of the quaternary ammonium salt.

11. The resist stripper according to claim 1, for stripping of a titanium oxide.

12. The resist stripper according to claim 1, for stripping of a resist or a resist residue remaining after development of a photoresist and formation of a circuit.

13. A resist stripper according to claim 10, wherein the peroxyhydrate of a quaternary ammonium salt is peroxyhydrate of tetramethylammonium hydroxide.

14. A resist stripper according to claim 10, wherein the peroxyhydrate of a quaternary ammonium salt is peroxyhydrate of tetraethylammonium hydroxide.

* * * * *